(12) United States Patent
Suzuki et al.

(10) Patent No.: US 7,453,749 B2
(45) Date of Patent: Nov. 18, 2008

(54) SEMICONDUCTOR MEMORY DEVICE WITH ELECTRICALLY REWRITABLE AND NON-VOLATILE MEMORY CELLS ARRANGED THEREIN

(75) Inventors: Toshihiro Suzuki, Kawasaki (JP); Haruki Toda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 79 days.

(21) Appl. No.: 11/623,907

(22) Filed: Jan. 17, 2007

(65) Prior Publication Data
US 2007/0165473 A1 Jul. 19, 2007

(30) Foreign Application Priority Data
Jan. 17, 2006 (JP) ............... 2006-008180

(51) Int. Cl.
*G11C 7/00* (2006.01)
(52) U.S. Cl. ............. 365/203; 365/185.17; 365/185.23; 365/185.25; 365/189.07
(58) Field of Classification Search ................. 365/203, 365/185.17, 185.23, 185.25, 189.07
See application file for complete search history.

(56) References Cited
U.S. PATENT DOCUMENTS

| | | | |
|---|---|---|---|
| 4,984,204 A * | 1/1991 | Sato et al. ............... | 365/189.11 |
| 5,740,112 A * | 4/1998 | Tanaka et al. .......... | 365/189.15 |
| 6,807,096 B2 | 10/2004 | Toda | |
| 6,809,989 B2 * | 10/2004 | Takahashi et al. ...... | 365/230.08 |
| 6,847,555 B2 | 1/2005 | Toda | |
| 7,064,981 B2 | 6/2006 | Roohparvar | |
| 2006/0239073 A1 | 10/2006 | Toda | |
| 2007/0165473 A1 | 7/2007 | Suzuki et al. | |
| 2008/0098165 A1 * | 4/2008 | Shinozaki et al. ........... | 711/103 |

OTHER PUBLICATIONS

U.S. Appl. No. 11/476,023, filed Jun. 28, 2006, Haruki Toda.
U.S. Appl. No. 11/832,987, filed Aug. 2, 2007, Toda.

* cited by examiner

*Primary Examiner*—Tuan T. Nguyen
(74) *Attorney, Agent, or Firm*—Oblon, Spivak, McClelland, Maier & Neustadt, P.C.

(57) ABSTRACT

A semiconductor memory device includes: a cell array with electrically rewritable and non-volatile memory cells disposed at crossings between bit lines and word lines, which intersect with each other; a row decoder configured to drive the word lines; and a sense amplifier so coupled to a selected bit line as to compare a cell current with a reference current and sense data of a selected memory cell in the cell array, wherein bit line precharge is performed for a certain time prior to the sense amplifier activation in a data read mode while word line boost is performed in advance of the bit line precharge.

17 Claims, 16 Drawing Sheets

SEMICONDUCTOR MEMORY DEVICE WITH ELECTRICALLY REWRITABLE AND NON-VOLATILE MEMORY CELLS ARRANGED THEREIN

CROSS-REFERENCE TO RELATED APPLICATION

This application is based on and claims the benefit of priority from the prior Japanese Patent Application No. 2006-008180, filed on Jan. 17, 2006, the entire contents of which are incorporated herein by reference.

BACKGROUND OF THE INVENTION

1. Field of the Invention

This invention relates to a semiconductor memory device with electrically rewritable and non-volatile memory cells arranged therein.

2. Description of the Related Art

There is increased a demand for NAND-type flash memories in accordance with such uses are increased that mobile devices deal with large capacitive data such as still and moving images With a multi-level data storage technology, in which one memory cell stores two or more bits, it becomes possible to make the flash memory chip small and possible to store more information.

In the NAND-type flash memory, multiple memory cells are connected in series to constitute a NAND string. Therefore, the cell current is small and it is not suitable to be adapted to high-speed random access systems. The data transmission rate is usually made high in such a manner that data are read out to a page buffer and then serially output, whereby the flash memory may be adapted to a high-speed system via a buffer memory such as DRAM.

Conventionally, the sense amplifier in the NAND-type flash memory detects whether the charge in the latch is discharged or not in accordance with a selected memory cell's ON/OFF, thereby reading out data. With this scheme, it takes a long time, some micro seconds, to access and read a memory cell.

By contrast, there has already been proposed a flash memory with a high-rate sensing property, in which two memory cells are simultaneously selected and subjected to data sense with a current detecting type sense amplifier for detecting the current difference (refer to Unexamined Japanese Patent Application Publication No. 2004-319007).

While, in case such a sense amplifier is used that senses a small current difference at a high rate, it becomes impossible to ignore a transitional current on a bit line due to capacitive coupling caused at a word line rising time. That is, when a word line is boosted, a transitional current flows on a bit line because the word line voltage is coupled to the bit line via a cell capacitance and a cell channel. The transitional current on the bit line will be referred to as a "word line coupling current", or more simply referred to as a "coupling current" hereinafter. In case the cell current to be detected is small, the word line coupling current prevents the sense amplifier from sensing the cell current.

Further, the influence of the word line coupling current will be changed in correspondence with the selected cell's location on the bit line because the bit line resistance and capacitance become large in accordance with increase of the cell array, and the coupling noise on the sense amplifier is changed in correspondence with the word line location.

SUMMARY OF THE INVENTION

According to a first aspect of the present invention, there is provided a semiconductor memory device including:

a cell array with electrically rewritable and non-volatile memory cells disposed at crossings between bit lines and word lines, which intersect with each other;

a row decoder configured to drive the word lines; and a sense amplifier so coupled to a selected bit line as to compare a cell current with a reference current and sense data of a selected memory cell in the cell array, wherein bit line precharge is performed for a certain time prior to the sense amplifier activation in a data read mode while word line boost is performed in advance of the bit line precharge.

According to a second aspect of the present invention, there is provided a semiconductor memory device including;

a cell array with electrically rewritable and non-volatile memory cells disposed at crossings between bit lines and word lines, which intersect with each other;

a sense amplifier so coupled to a selected bit line as to sense data of a selected memory cell in the cell array;

a first bit line precharge circuit so disposed at one end of a bit line near the sense amplifier as to precharge the bit line for a certain time prior to the sense amplifier activation; and a second bit line precharge circuit so disposed at the other end of the bit line far from the sense amplifier as to precharge the bit line simultaneously with the first bit line precharge circuit.

According to a third aspect of the present invention, there is provided a semiconductor memory device including:

a cell array with electrically rewritable and non-volatile memory cells disposed at crossings between bit lines and word lines, which intersect with each other;

a sense amplifier so coupled to a selected bit line as to sense data of a selected memory cell in the cell array; and a bit line precharge circuit attached to the sense amplifier for precharging a bit line for a certain time in advance of the sense amplifier activation, wherein the bit line precharge current is supplied in such a manner that it is changed in correspondence with a selected area in the bit line direction in the cell array.

According to a fourth aspect of the present invention, there is provided a semiconductor memory device including:

a cell array with electrically rewritable and non-volatile memory cells disposed at crossings between bit lines and word lines, which intersect with each other, a plurality of memory cells being connected in series to constitute a NAND string in the cell array; and a sense amplifier so coupled to a selected bit line as to sense data of a selected memory cell in the cell array, wherein data write of the cell array is performed in such a way that memory cells in the NAND string are sequentially selected from the bit line side, so that the word line coupling current input to the sense amplifier at a write-verify time is equalized to that at a normal read time.

DETAILED DESCRIPTION OF THE EMBODIMENTS

Illustrative embodiments of this invention will be explained with reference to the accompanying drawings below.

Figure 1:
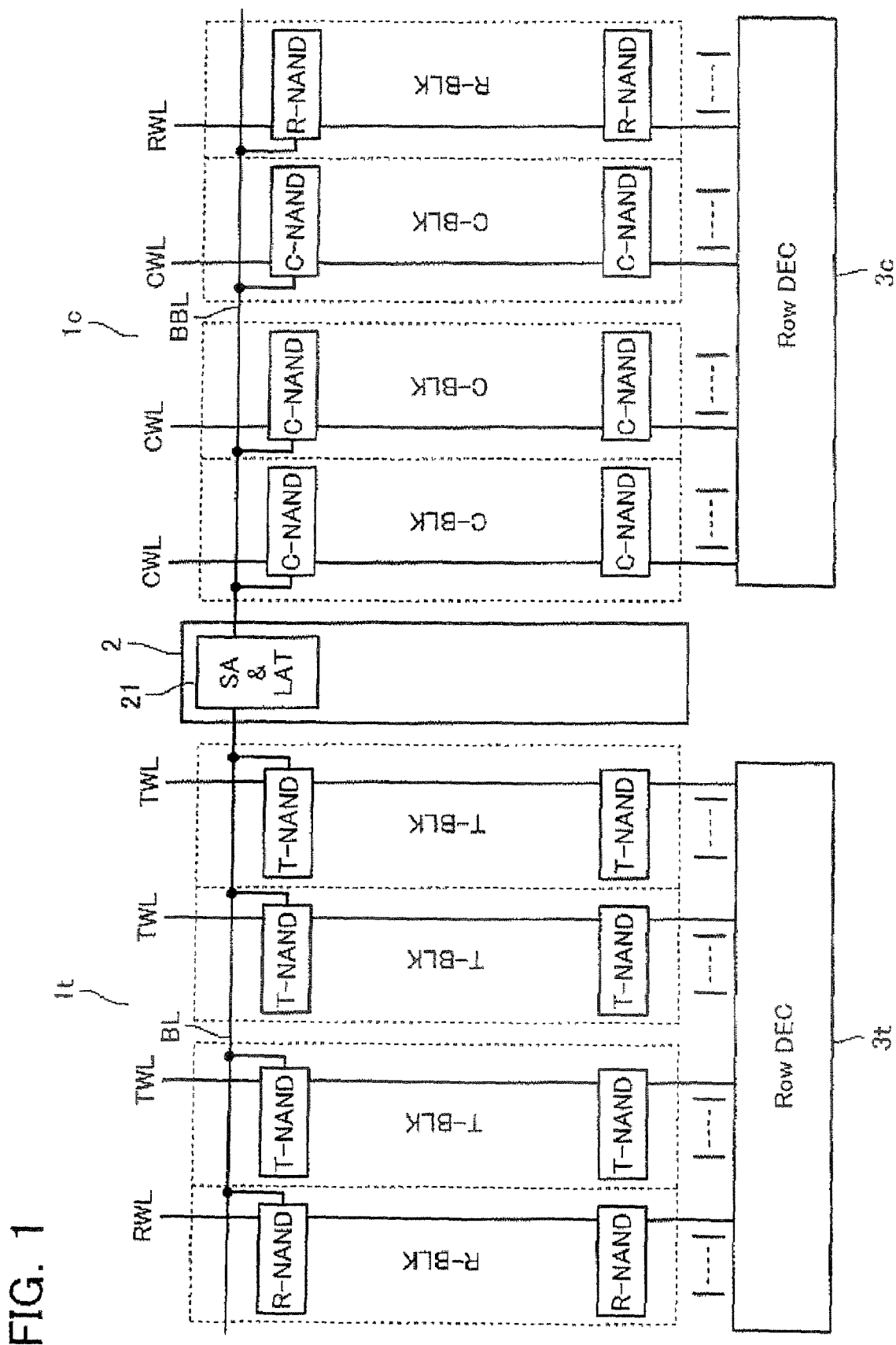
FIG. 1 shows a memory core of a NAND-type flash memory in accordance with an embodiment of the present invention.

FIG. 1 shows a memory core of a NAND-type flash memory in accordance with an embodiment. This memory core has a cell array including arrays 1t and 1c, sense amplifier circuit 2, which arrays 1t and 1c share, and row decoders 3t and 3c, which selectively drives word lines (TWL, CWL, RWL) in the arrays 1t and 1c.

In this embodiment, a current-detecting type of differential amplifier is used in the sense amplifier circuit 2. Therefore, in one cell array 1t, there are disposed a plurality of information cell (T-cell) blocks T-BLK and one reference cell (R-cell) block R-BLK, and in the other cell array 1c, there are disposed a plurality of information cell (C-cell) blocks C-BLK and one reference cell (R-cell) block R-BLK.

There is no difference in structure between the information cell block T-BLK or C-cell and the reference cell block R-BLK. That is, at least one is selected as the reference cell block R-BLK within plural cell blocks in each array 1t, 1c. As described later, in case of a four-level data storage scheme, one of four data levels is written into each cell in the information cell block T-BLK, C-BLK while a reference level is written into each cell in the reference cell block R-BLK.

Figure 2:
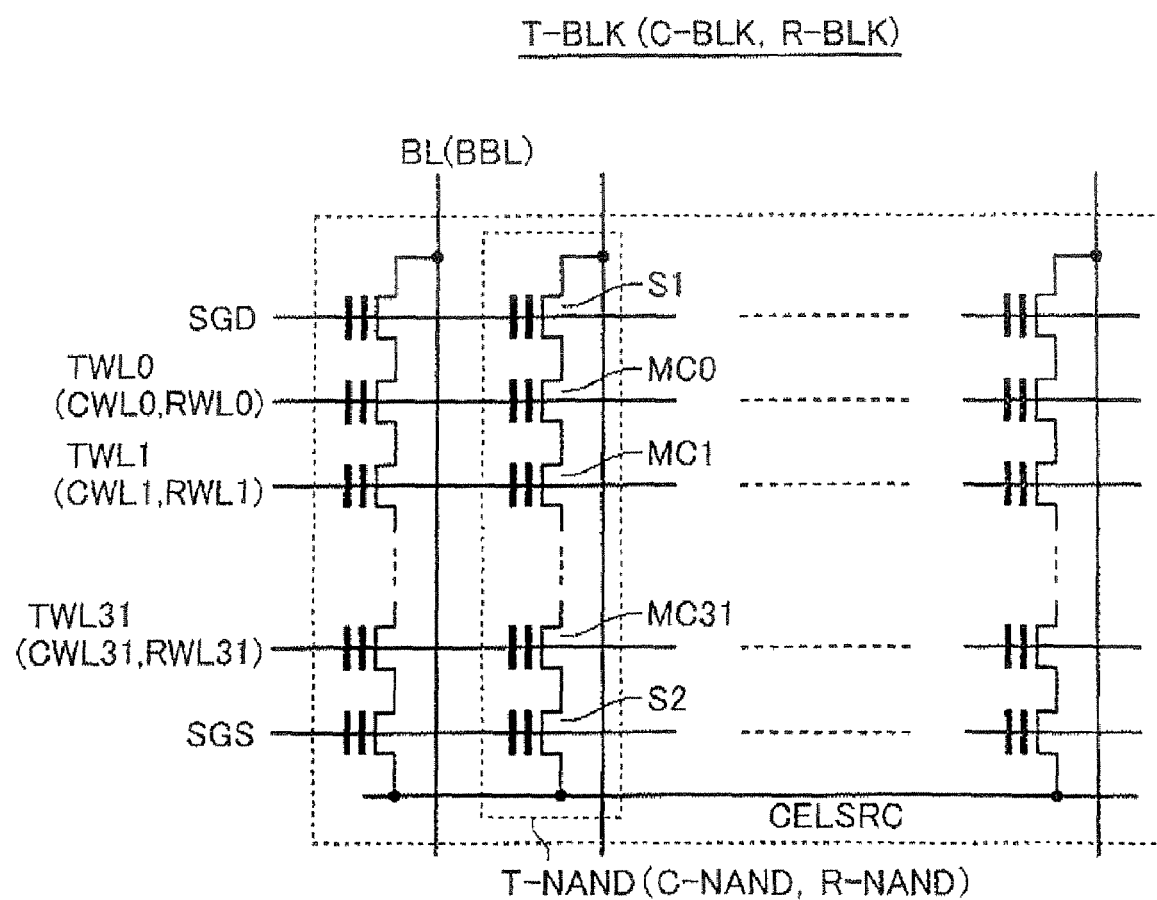
FIG. 2 shows the cell block configuration of the flash memory.
Figure 3:
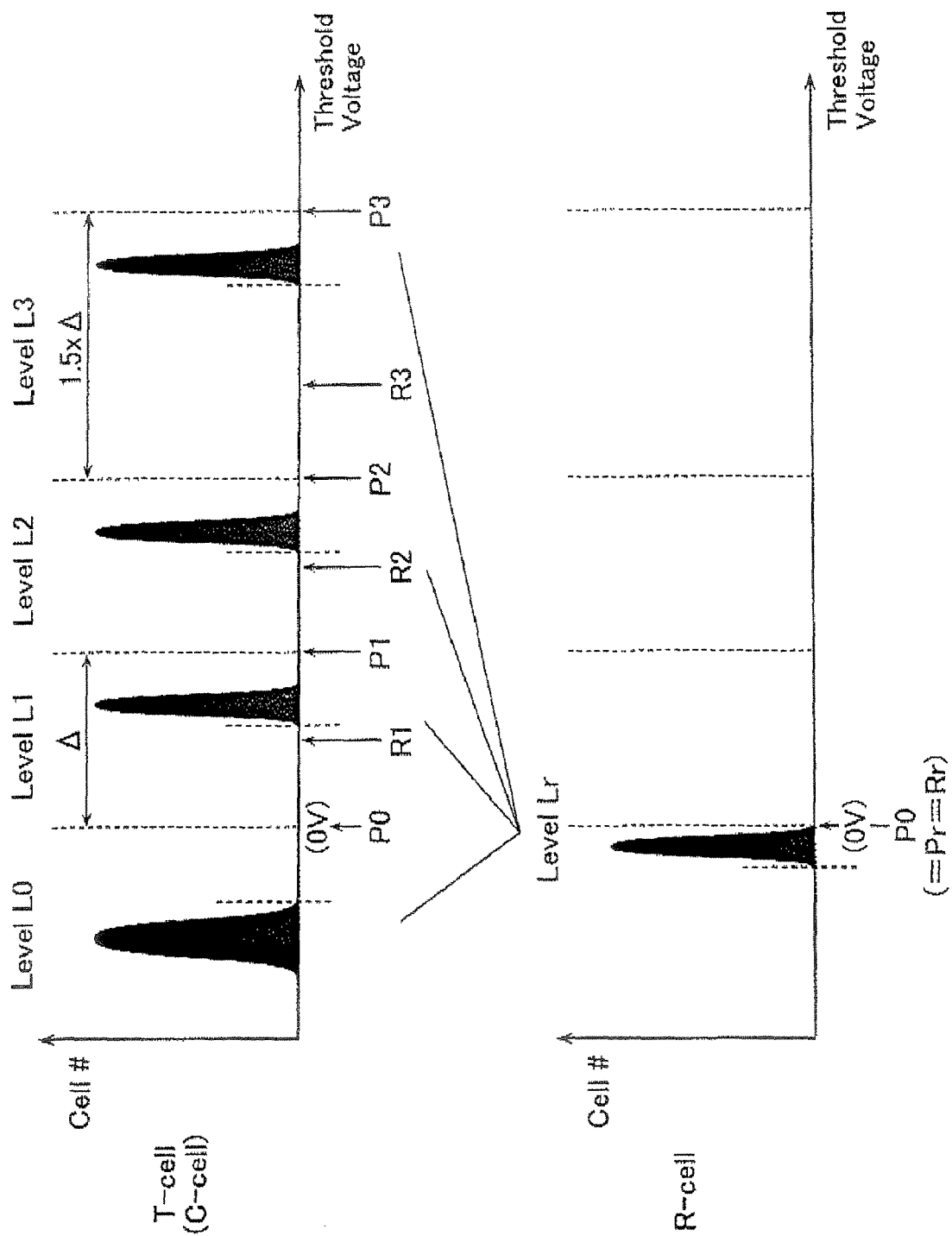
FIG. 3 is a diagram for explaining four-level data storage scheme of the flash memory.

The cell block T-BLK (or C-BLK, R-BLK) is, as shown in FIG. 2, formed of a plurality of NAND strings T-NAND (or C-NAND, R-NAND) arranged therein Each NAND string has a plurality of electrically rewritable and non-volatile memory cells MC0-MC31 connected in series and select gate transistors S1 and S2 disposed at both ends thereof.

Control gates of memory cells MC0-MC31 are coupled to different word lines TWL0-TWL31 (or CWL0-CWL31, RWL0-RWL31); and the gates of the select gate transistors S1 and S2 are coupled to select gate lines SGD and SCS.

Bit lines BL and BBL of cell arrays 1t and 1c constitute a pair and are coupled to sense amplifier circuit 2. While one information cell block T-BLK (or C-BLK) is selected from one array 1t (or 1c), the reference cell block R-BLK is selected from the other array 1c (or 1t). A selected information cell's current and a selected reference cell's current are input to the sense amplifier circuit via bit lines BL and BBL.

Figure 4:
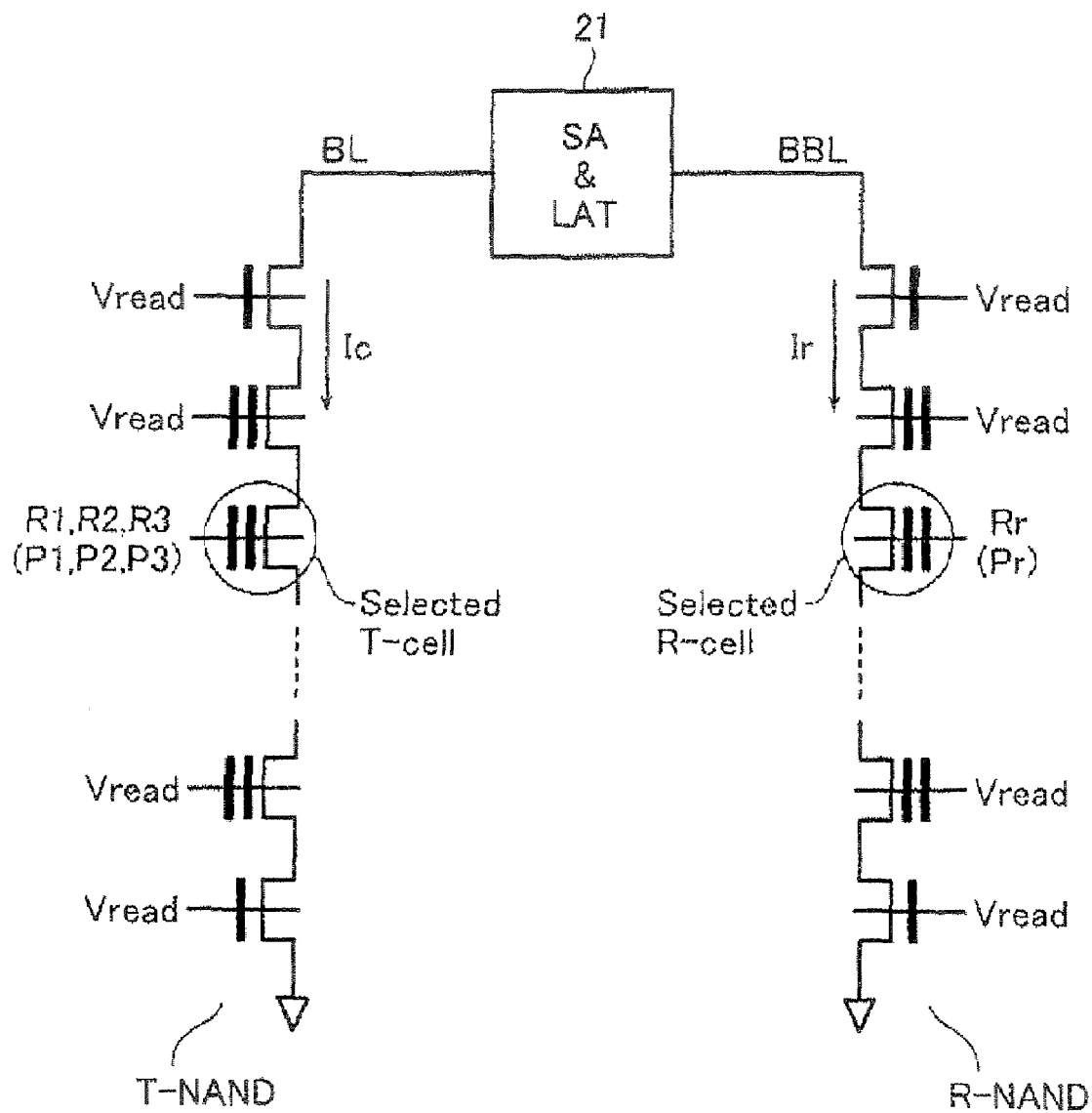
FIG. 4 is a diagram for explaining the sensing scheme of the sense unit.

FIG. 4 shows data levels of the information cell T-cell, C-cell and reference cell R-cell in such a case that a four-level data storage scheme is used. One of four data levels L0-L3, which are defined by cell's threshold voltages, is written into the information cell T-cell or C-cell while reference level Lr defined by the cell's threshold voltage is written into the reference cell R-cell.

The lowest data level L0 is an erase state with a negative threshold voltage, which is defined by the verify voltage P0. Data levels L1-L3 are positive threshold voltage states, which are defined by verify voltages P1-P3, respectively. Reference level Lr is a state of about 0V threshold, which is defined by verify voltage Pr (=0V).

Data erase is performed by a block in such a way that all word lines in the block are set at 0V; and erase voltage Vera is applied to p-type well, on which the cell array is formed, thereby releasing electrons in the floating gates of memory cells. Information cell blocks T-BLK, C-BLK and reference cell block R-BLK will be erased in accordance with the same erase procedure.

Data write is performed as an electron injection operation into the floating gate of a selected memory cell in response to write data under the condition that write voltage Vpgm is applied to a selected word line in a selected block. Data write is subjected to the same procedure for not only information cell blocks T-BLK, C-BLK but also reference cell blocks R-BLK. With the verify voltages P1-P3 and Pr used at the write-verify time, data levels L1-L3 and Lr will be obtained, respectively.

Although the same data levels are written into information cells T-cell and C-cell in the cell arrays 1t and 1c, the sense amplifier senses these data as revered data because the sense amplifier detects the cell current difference between the information cell and the reference cell For example, in the information cell T-cell in array 1t, data are defined as follows: L0=(1,0), L1=(1,1), L2=(0,1) and L3=(0,0). By contrast, in the information cell C-cell in array 1c, data are defined as follows: L0=(0,0), L1=(0,1), L2=(1,1) and L3=(1,0).

To judge the data levels L0-L3 in comparison with the reference level Lr at a data read time, read voltages R1, R2 and R3 are applied to a selected word line at three read steps, respectively. Read voltage Rr applied to the reference cell R-cell is about the same level as the reference level Lr. At a write-verify read time, verify voltages P1, P2 and P3 are used for the information cell while verify voltage Pr (=Rr) is for the reference cell.

FIG. 4 shows bias conditions in a normal data read mode and write-verify read mode. One information cell T-cell is selected in an information cell NAND string T-NAND disposed on the bit line BL side while one reference cell R-cell is selected in a reference cell NAND string R-NAND disposed on the bit line BBL side. Selected word lines coupled to the selected information cell and reference cell are applied with read voltage R1 (or R2, R3) and Rr, respectively. Other non-selected word lines and select gate lines are applied with pass voltage Vread, which turns on cell without regard to cell data.

At a write-verify time, either one of verify voltages P1-P3 is applied to the information cell in place of the read voltage R1-R3; and verify voltage Pr to the reference cell, On the above-described bias condition, difference between cell current Ic flowing in the information cell NAND string and reference current Ir flowing in the reference cell NAND string is detected, whereby cell data will be judged.

Figure 5:
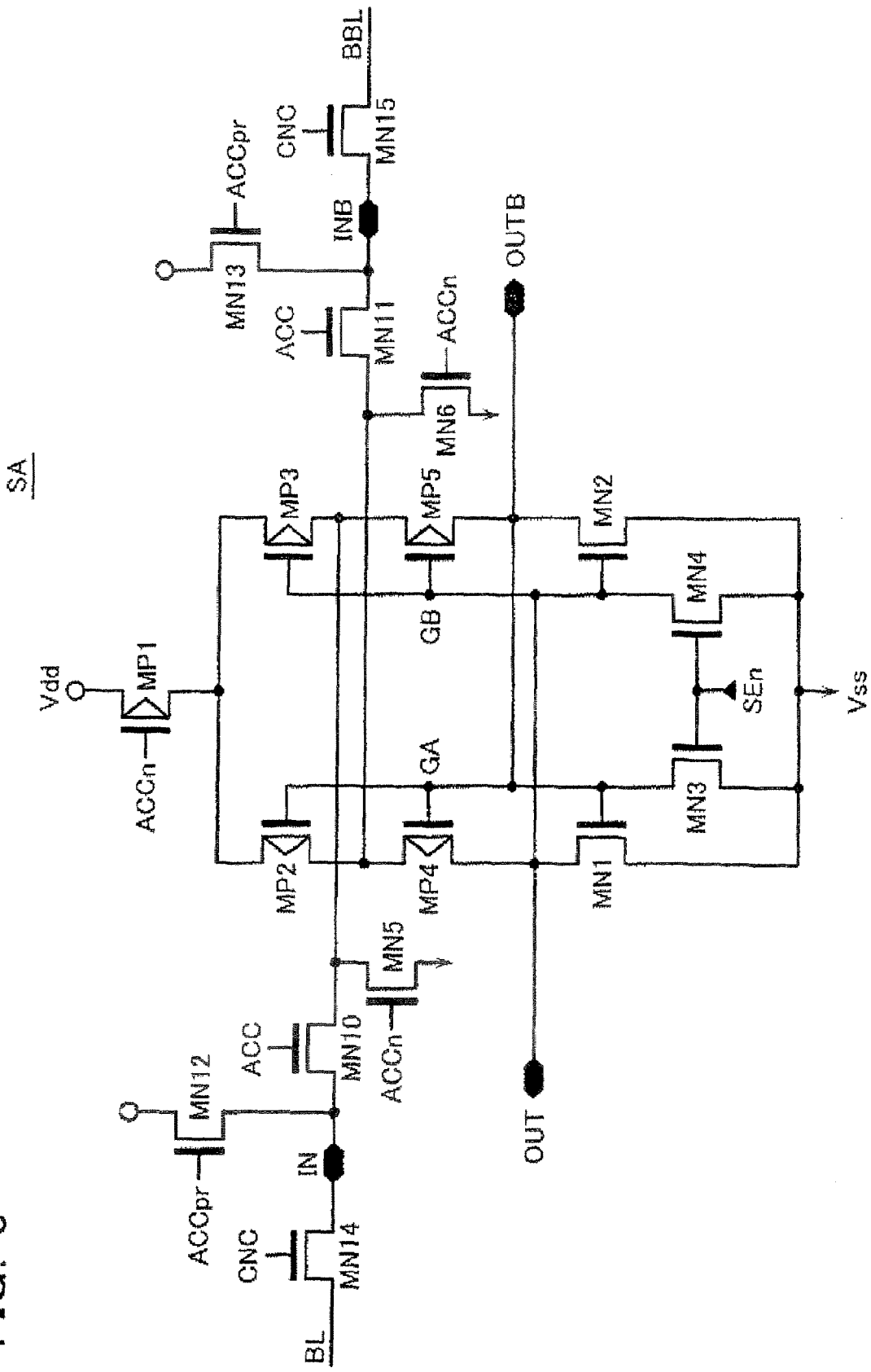
FIG. 5 shows the sense amplifier in the sense unit.

FIG. 5 shows a sense amplifier SA in a sense unit 21 in the sense amplifier circuit 2. Although the sense unit 21 includes a sense amplifier SA and a data latch LAT for storing read data and write data, only the sense amplifier SA will be described below.

The sense amplifier SA shown in FIG. 5 is a latch type one formed for the purpose of sensing the cell current of about 1 μA at a high rate. This sense amplifier SA has a latch formed of a pair of PMOS transistor MP4 and NMOS transistor MN1 and another pair of PMOS transistor MP5 and NMOS transistor MN2. The common drain of the PMOS transistor MP4 and NMOS transistor MN1 is coupled to a first output node OUT; and the common gate GA thereof to a second output node OUTB. Similarly, the common drain of the PMOS transistor MP5 and NMOS transistor MN2 is coupled to the second output node OUTB; and the common gate GB thereof to the first output node OUT.

Sources of NMOS transistors MN1 and MN2 are coupled in common to the ground potential node Vss. Disposed between the gates GA, GB and the ground potential node Vss are NMOS transistors MN3 and MN4, which are on in a stationary state and turned off in response to sense signal SEn="L". These NMOS transistors 3 and MN4 serve for amplifying cell current at the beginning of data sensing while sense signal SEn is "H".

Sources of PMOS transistors MP4 and MP5 are coupled to input nodes INB and IN, respectively, and PMOS transistors MP2, MP3 are disposed between the PMOS transistors MP4, MP5 and the current source switching device PMOS transistor MP1. Gates of PMOS transistors MP2 and MP3 are coupled to the common gate nodes GA and GB, respectively.

Disposed at the input nodes IN and INB, to which bit lines BL and BBL are coupled, are reset NMOS transistors MN5 and MN6, which are controlled with activation signal ACCn. Further disposed at the input nodes IN and INB are NMOS transistors MN12 and MN13 for precharging bit lines BL and BBL, respectively, and NMOS transistors MN10 and MN11 for isolating the sense amplifier SA from the bit lines BL and BBL.

Further, there is provided high breakdown voltage NMOS transistors (M14 and MN15) between the input nodes (IN and INS) and bit lines (BL and BBL), respectively, for preventing the sense amplifier SA being applied with a high voltage at an erase time.

Figure 6:
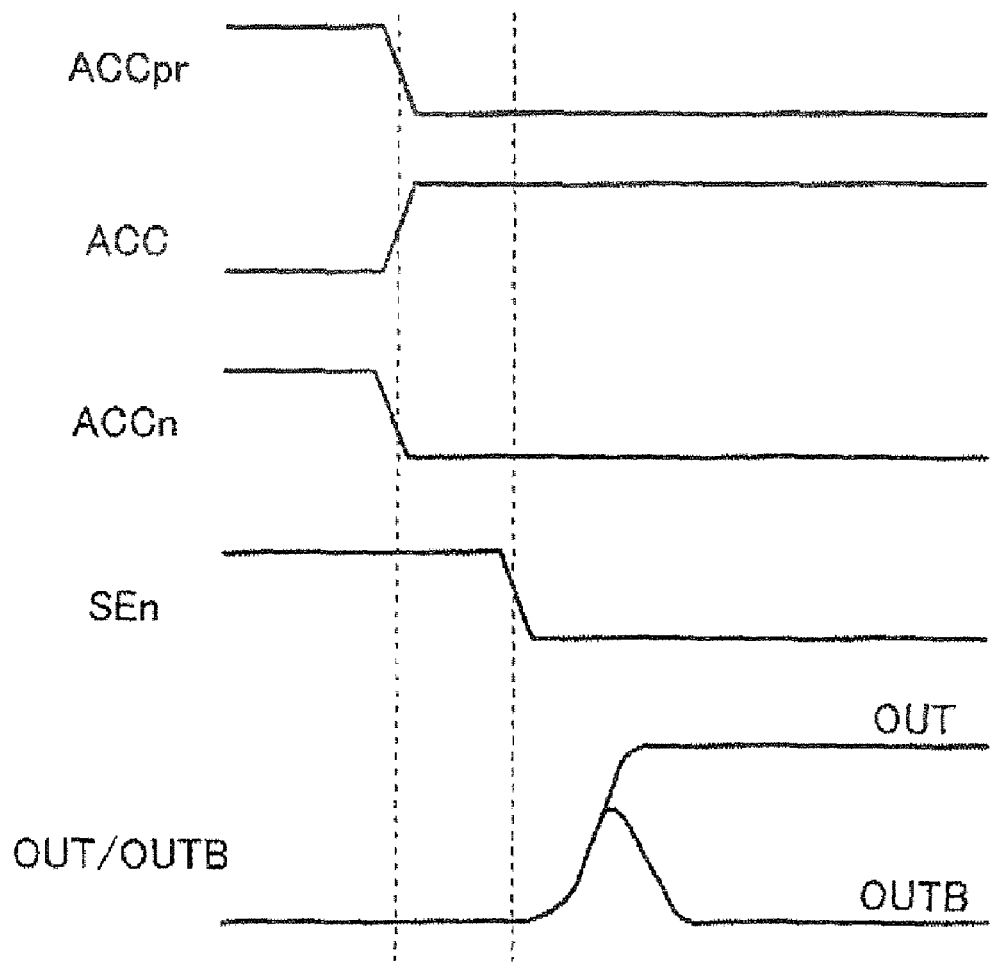
FIG. 6 shows waveforms of the sense amplifier.

FIG. 6 shows operation waveforms of the sense amplifier SA. In the sense amplifier SA, PMOS transistors MP1, NMOS transistors MN3, MN4, MN5 and MN6 are off during a non-active period with ACCn=SEn="H". Therefore, input nodes IN, INB and output nodes OUT, OUTB are kept in a low level of Vss.

Prior to the sense amplifier activation, signal ACCpr being set to be "H" for a certain time, bit lines EL and BBL are precharged via NMOS transistors MN12 and MN13. Then signals ACCpr and ACCn are set to be "L", the current source will be exchanged. That is, the current source PMOS transistor MP1 is turned on in place of the precharge NMOS transistors MN12 and MN13, and transfer NMOS transistors MN10 and MN11 are also turned on.

As a result, the sense amplifier SA is activated, and simultaneously with it, the information cell's current (i.e., cell current) Ic and the reference cell's current Ir (i.e., reference current) are input to the sense amplifier SA. In the sense amplifier SA, a small current difference is generated between a current pass formed of PMOS transistor MP5 and NMOS transistor MN3 and another current pass formed of PMOS transistor MP4 and NMOS transistor MN4 in response to the cell current difference Ic−Ir, thereby generating a small voltage difference between the output nodes OUT and OUTB. This is an initial amplifying operation at the beginning of data sensing.

Thereafter, NMOS transistors MN3 and MN4 being turned off with the sense signal SEn="L", the voltage difference between the output nodes OUT and OUTB is amplified based on the positive feedback of the Latch, thereby finally resulting in that one of the output nodes is set to be high (=Vdd); and the other low (Vss). For example, in case of Ic>Ir, as shown in FIG. 6, OUT="H"; and OUTB="L" will be obtained.

Since this sense amplifier SA is of a current detecting type, bit line capacitances coupled to the bit lines BL and BBL do not affect the sense speed. Therefore, even if the bit line capacitance is about several pF and the cell current is as small as about several hundred nA in the NAND-type flash memory, it becomes possible to sense data at a sufficiently high rate.

In case the cell current is as small as several hundred nA in the above-described NAND-type flash memory, the influence of the current coupled to the bit line from the word line due to capacitive coupling, i.e., word line coupling current can not be ignored. Some method of reducing the influence of the above-described coupling current will be explained below. It is supposed here that word line resistance is 120 kΩ; word line capacitance is 0.34 pF, bit line resistance is 60 kΩ; and bit line capacitance is 1 pF.

[Word Line Driving Scheme]

Figure 7:
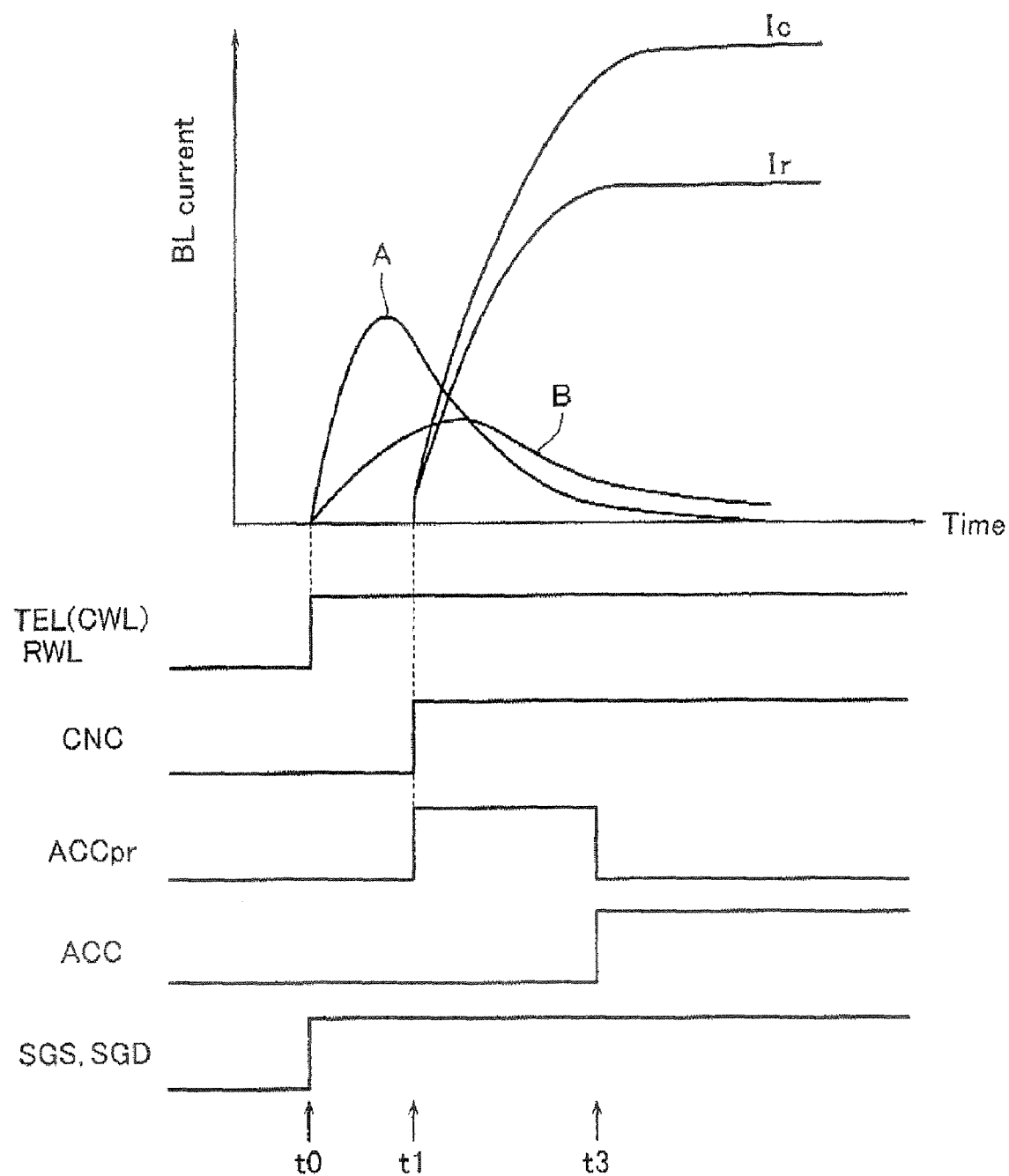
FIG. 7 is a diagram for explaining the word line driving scheme in this embodiment.

FIG. 7 shows a word line driving method, which is made possible to reduce the word line coupling current input to the sense amplifier The coupling current generated when the word line is raised does not flow in a stationary state, but shows a peak and then is decreased in level in accordance with the bit line delay. In FIG. 7, two coupling current waveforms A and B are shown. The waveform A is in such a case that the selected NAND string is near the sense amplifier while the waveform B is in such a case that the selected NAND string is far from the sense amplifier.

If the selected NAND string is near the sense amplifier, as shown by waveform A, the peak of the coupling current is large, and the delay due to bit line capacitance and resistance is small. While, the selected NAND string is far from the sense amplifier, as shown by waveform B, the peak of the coupling current is relatively small, but the delay becomes large because the bit line resistance and capacitance become large. Supposing that the coupling current peak of waveform A reaches dozens nA; and cell current Ic is several hundred nA, the current sensing becomes problematic.

In the scheme shown in FIG. 7, word line rise timing t0 is set to be in advance of the bit line precharge-start timing t1 when the signal ACCpr is raised. As a result, at the sense-start timing t3 when the activation signal ACC is raised and the bit line precharge transistors are turned off, the coupling current input to the sense amplifier may be significantly reduced.

Note here that the meaning of "word line rising" includes, as explained with reference to FIG. 4, the following situations: a selected word line rising with a read voltage applied: non-selected word lines rising simultaneously with the pass voltage Vread applied; and select gate lines rising simultaneously with the pass voltage (or other suitable voltage) applied. As a result, as shown in FIG. 7, precharge current starts to flow on the bit line at timing t0 when the precharge signal ACCpr rises, and cell current Ic and reference current Ir are determined in accordance with the selected information cell and reference cell. The sense amplifier being activated at timing t3, the cell current Ic and reference current Ir are input to the sense amplifier.

Word line coupling current is one reverse to the cell current Ic and reference current Ir. The word line rising being in advance of the bit line precharge-start, it becomes possible to reduce the coupling current input to the sense amplifier to about several nA. In other words, according to this word line coupling scheme, ratio of the absolute coupling current to the cell current may be lessened. Therefore, it becomes possible to achieve a high-speed data sensing performance with a small cell current.

On the other hand, the fact that the coupling current is varied in accordance with the read cell location leads to sense margin reduction. Even if the cell current is small and the coupling current variation is small, this is problematic. The coupling current has such a property that it becomes large in proportion to the voltage between the read cell transistor's gate and the bit line, to which the NAND string is coupled.

Therefore, it is effective to make the word line rising voltage low, thereby making the gate-bit line voltage relatively small. However, there is a limit for lowering the voltage because it is in need of boosting the pass word line level Vread to turn on cell without regard to cell data.

[Bit Line Precharge Scheme—Precharge from Both Ends]

Figure 8:
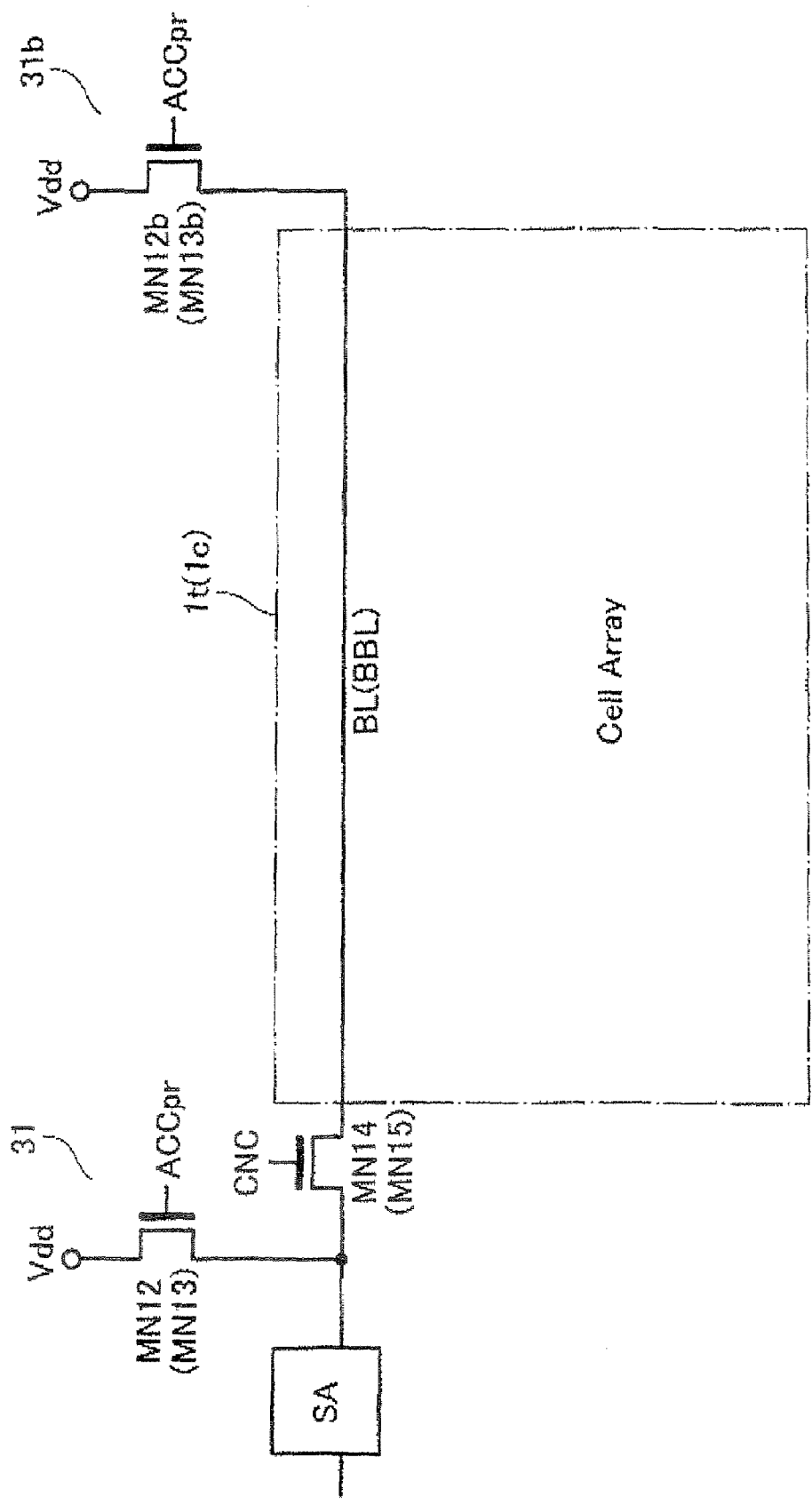
FIG. 8 is a diagram for explaining the bit line precharge scheme in this embodiment.

In consideration of the above-described situation, a preferable bit line precharge method will be used to boost the bit line voltage and make the gate-bit line voltage relatively small. As shown in FIG. 8, in addition to the bit line precharge circuit 31 (transistor MN12 or MN13), which is disposed at one end of the bit line BL (or BBL) near the sense amplifier SA, another bit line precharge circuit 31b (transistor MN12b or MN13b) is disposed at the other end of the bit line far from the sense amplifier SA.

These bit line precharge circuits 31 and 31b are driven simultaneously with the precharge signal ACCpr to precharge the bit line BL (or BBL) from the opposite sides of the cell array 1t (or 1c).

Figure 9:
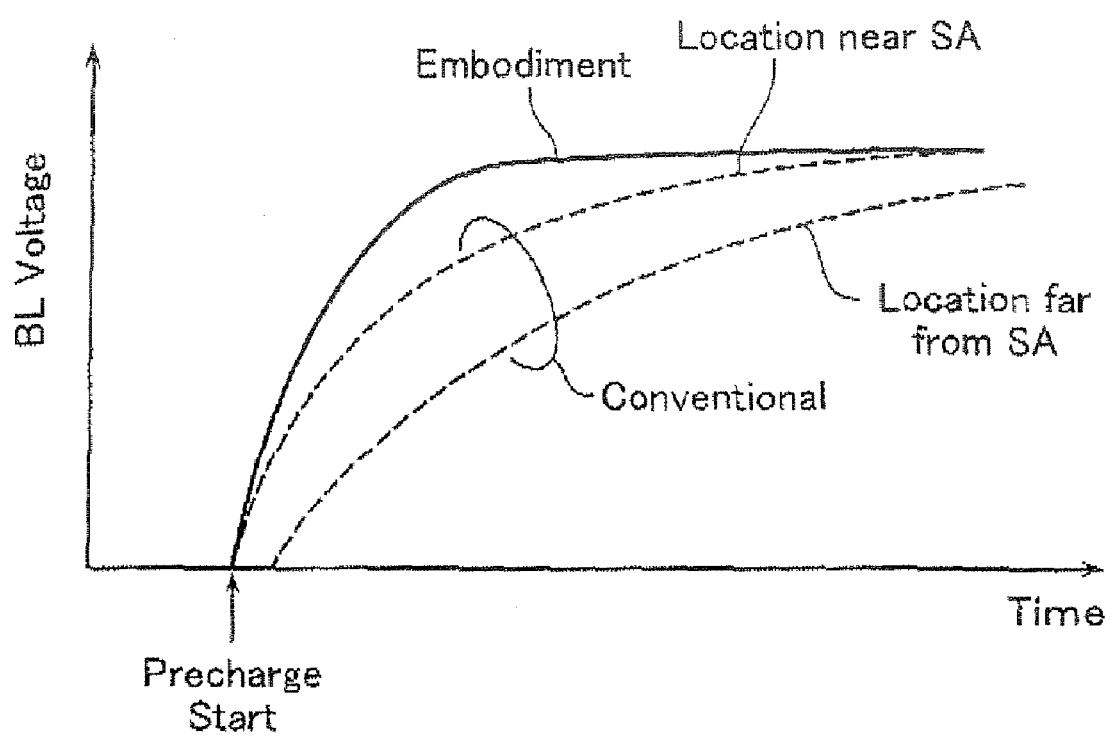
FIG. 9 is a diagram for explaining the bit line voltage change with the bit line precharge scheme

FIG. 9 shows the bit line voltage change (solid line) in a case that the above-described bit line precharge scheme is adapted in comparison with the conventional case (doted line). With this scheme, it becomes possible to charge-up the bit line to a potential higher than the conventional one within the same precharge period. As a result, the gate-bit line voltage may be reduced, and it becomes possible to suppress the absolute word line coupling current.

Further, in the conventional case, the bit line potential is not made uniform at the precharge end timing due to the bit line delay, thereby resulting that the bit line current is varied in correspondence with the selected cell location; By contrast, according to the bit line precharge scheme, in which a bit line is precharged from both end thereof, the uniformity of the bit line potential is improved, and the coupling current variation dependent on the cell location will be reduced.

This bit line precharge scheme is preferably used together with the above-described word line driving scheme for improving the data sense performance. However, it is also effective to use the bit line precharge scheme independently of the word line driving scheme. That is, this bit line precharge scheme makes possible to boost the word line potential in a short time, thereby suppressing the absolute word line coupling current. Therefore, even if in such a case that the word line rises simultaneously with or late to the bit line precharge, the bit line precharge scheme is effective for improving the sense speed.

[Bit Line Precharge Scheme—Precharge Current Control]

Figure 10:
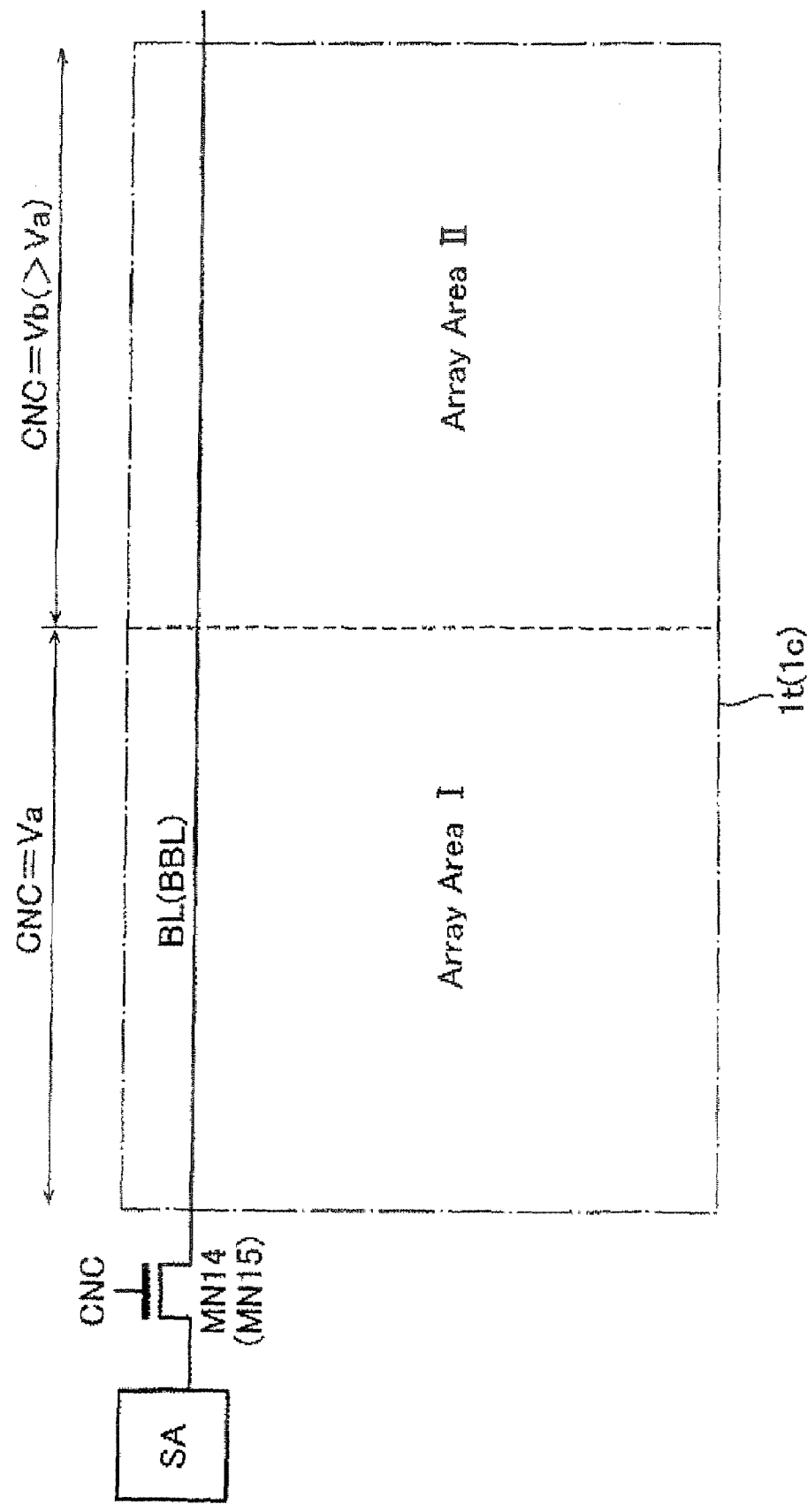
FIG. 10 is a diagram for explaining another bit line precharge scheme.

If the time constant of the bit line is large, it is generated such a situation that the bit line voltage is changed in correspondence to the selected cell location when the bit line precharge is ended. For example, as shown in FIG. 10, supposing that the cell array 1t (or 1c) is divided into two areas I and II in the bit line direction, the bit line voltage in the array area I is different from that in the array area II, Since the bit line precharge voltage defines the coupling current volume, the coupling current in case the array area I is selected is different from that in case the array area II is selected.

With respect to this point, there is provided such a scheme as to control the gate voltage of the high-breakdown voltage transistor MN14 (or MN15) in accordance with the selected cell location, thereby controlling the precharge current. Explaining in detail, when the area I near the sense amplifier is selected, the bit line precharge is performed with the gate voltage of CNC=Va, while when the area II far from the sense amplifier is selected, the bit line precharge is performed with the gate voltage of CNC=Vb(>Va).

That is, the bit line precharge current when the array II is selected is set to be larger than that when the array I is selected. As a result, the bit line voltages of the arrays I and II are made equal to each other when the bit line precharge is ended, resulting in that the coupling current variations between the cell arrays I and II are reduced.

Note here that the gate voltage difference of the high-breakdown transistor MN14 (or MN15) between when the cell array I is selected and when the cell array II is selected is about constant when the word line rise timing is defined.

Figure 11:
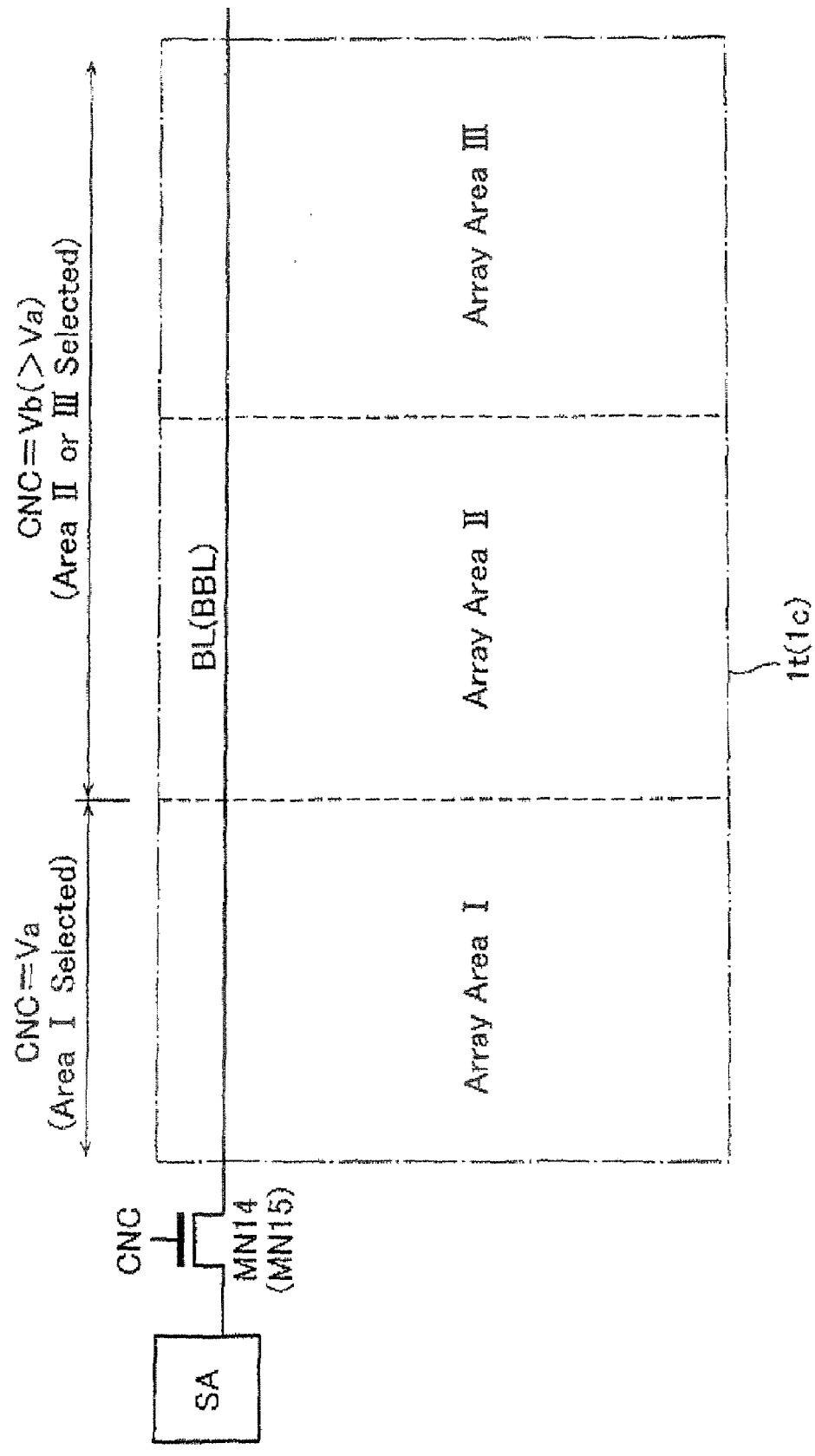
FIG. 11 is a diagram for explaining a modified scheme of the bit line precharge scheme shown in FIG. 10.

FIG. 11 shows such an example that the cell array 1t (1c) is divided into three areas I, II and III with the same size in the bit line direction, and gate voltage of the high-breakdown transistor MN14 (or MN15) is controlled in accordance with the selected cell location. In this case, considering the bit line voltage distribution due to the bit line precharge, the coupling current difference between when the cell array area II is selected and when the cell array area III is selected is smaller than that between when the cell array area I is selected and when the cell array area II (or III) is selected.

In consideration of the above-described situation, the bit line precharge is performed with the gate voltage CNC=Va when the area I near the sense amplifier is selected, while the higher gate voltage CNC=Vb(>Va) is used when area II or III far from the sense amplifier is selected. As a result, the coupling current variation due to the selected cell location will be sufficiently reduced.

Although the gate voltage of the high-breakdown transistor has been exchanged between two levels in accordance with the selected area in the above-described examples, it is possible to exchange the gate voltage between three or more levels in accordance with the cell array capacity.

This bit line precharge scheme, in which the precharge current is changed in correspondence with the selected area, is preferably used together with the word line driving scheme as described above for the purpose of improving the data sense speed. However, it is also effective to use the bit line precharge scheme independently of the word line driving scheme.

[Write Order]

Next, the influence of the coupling current due to the selected cell location in the NAND string will be explained. Many memory cells are connected in series in the NAND string, and as shown in FIG. 4, non-selected cells are applied with read pass voltage Vread at a read time to be dealt with pass transistors.

Since the pass transistor functions as a resistance for limiting the cell current, the larger the resistance, the less the coupling from a word line disposed on the source line side of the pass transistor to the bit line. While, the pass voltage Vread applied to non-selected word lines is higher than the read voltage used at a normal data read time or the verify voltage used at a write-verify time. Therefore, the coupling from the non-selected word line to the bit line is larger that that from the selected word line to the bit line.

On the above-described premises, considering the influences of the coupling currents at a write-verify read time and a normal read time, these become different from each other due to the write order in the NAND string.

Figure 12:
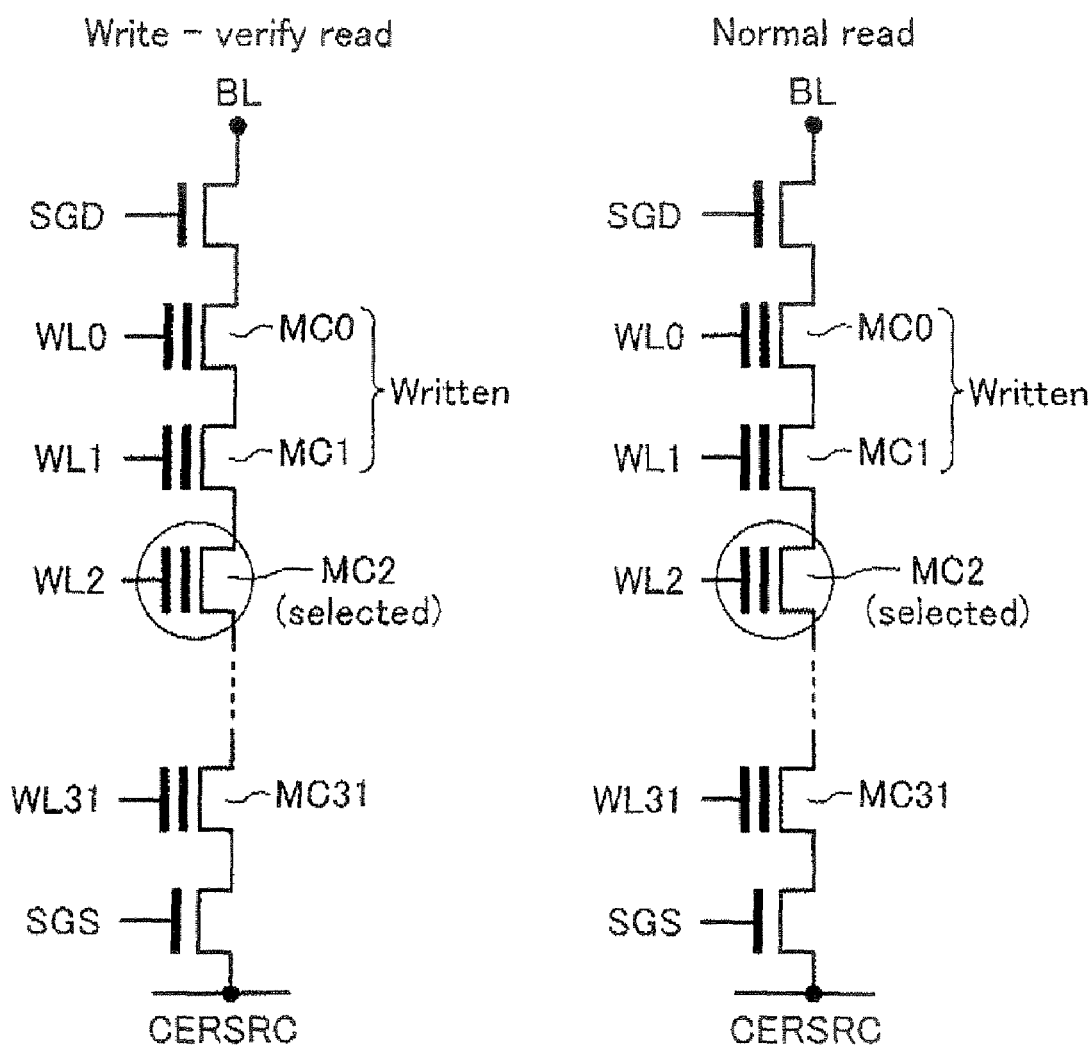
FIG. 12 is a diagram for comparing the coupling influence at the write-verify read time with that at the normal read time in case write is performed from bit line side.

The detail will be explained below. FIG. 12 shows that, in case data write is performed from the cell disposed near the bit line BL, the situation of the non-selected cells disposed on the bit line side of the selected memory cell at the normal read time is the same as that at the write-verify read time. Here is shown such a case that memory cell MC2 is selected with the word line WL2.

Figure 13:
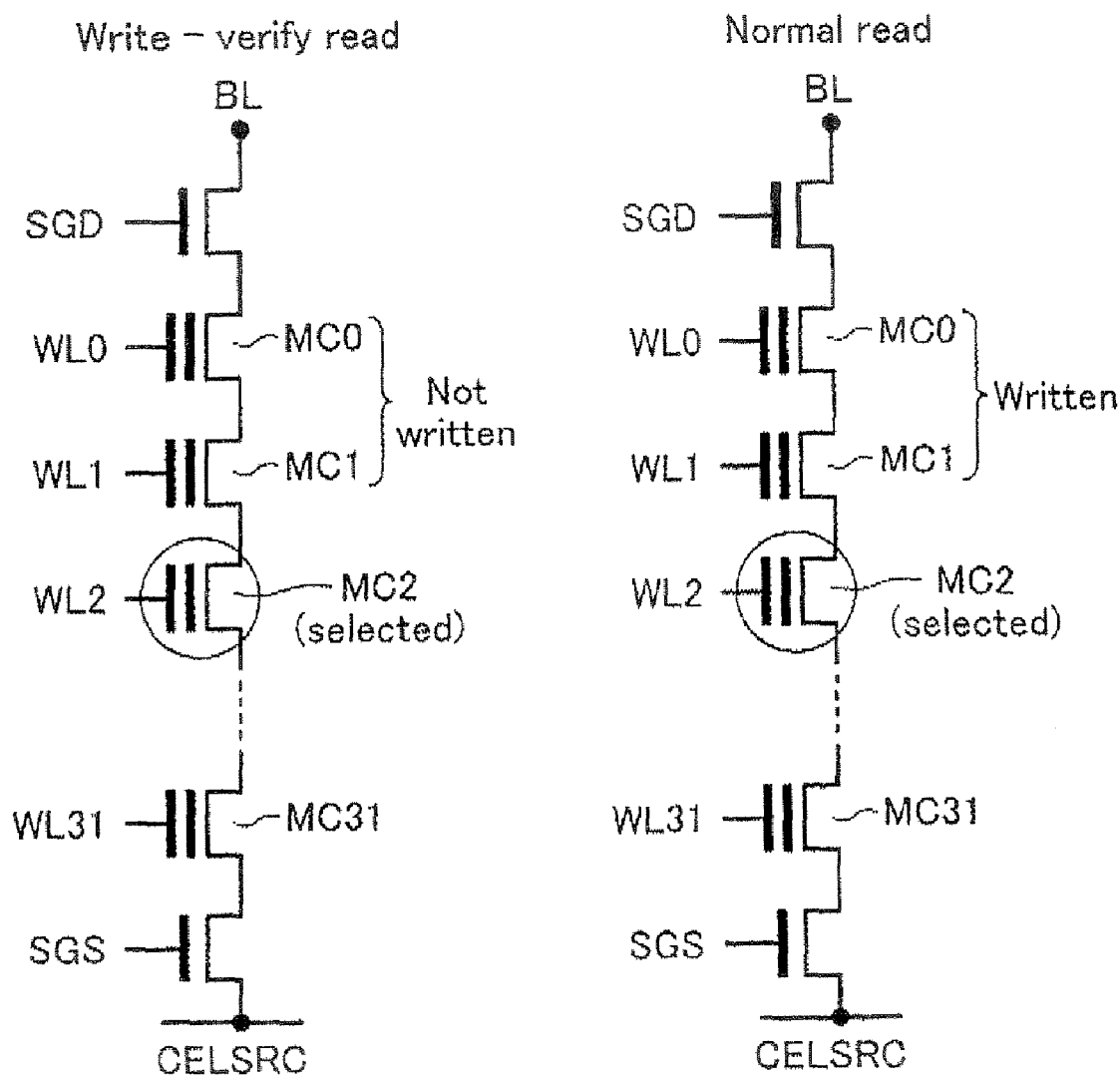
FIG. 13 is a diagram for comparing the coupling influence at the write-verify read time with that at the normal read time in case write is performed from source line side.

At the write-verify read time, non-selected cells MC0, MC1 on the bit line side of the selected cell MC2 have already been written. At the normal read time, non-selected cells MC0, MC1 on the bit line side of the selected cell MC2 have already been written because the normal read is performed after having written the entire NAND string. Therefore, the coupling influence from the word line to the bit line at the write-verify read time is the same as that at the normal read time, By contrast, FIG. 13 shows that, in case data write is performed from the cell disposed near the source line CELSRC, the situation of the non-selected cells disposed on the bit line side of the selected memory cell at the normal read time is different from that at the write-verify read time. Here is shown such a case that memory cell MC2 is selected with the word line WL2.

In this case, at the write-verify read time, non-selected cells MC0, MC1 on the bit line side of the selected cell MC2 have not been written (i.e., erase state). At the normal read time, non-selected cells MC0, MC1 on the bit line side of the selected cell MC2 have already been written Therefore, the coupling influence from the word line to the bit line at the write-verify read time is larger than that at the normal read time.

As described above, data write being performed from the cell on the bit line side, sense margins will be equalized to each other between the write-verify read time and the normal read time, and it is preferable for improving the sense speed. Further, according to such the scheme that the NAND string is written from the bit line side in order, the cell nearest the bit line, via which the influence of the word line coupling becomes largest in the NAND string, functions as a pass transistor with a large resistance. This is the same as if current limiting resistance was disposed between the bit line and the NAND string, thereby effectively reducing the influence of the word line coupling at the subsequent write-verify times.

The above-described write order defined in the NAND string is preferably used together with the word line driving scheme and the bit line precharge scheme as described above. However, it is also effective to use the write order independently of the word line driving scheme and the bit line precharge scheme.

In the above-described embodiment, four-level data storage scheme has been explained. However, the present invention is not limited to it. For example, the present invention will be adapted to such a case that multi-level data is expressed by three or more bits.

[Application Device]

As an embodiment, an electric card using the non-volatile semiconductor memory devices according to the above-described embodiments of the present invention and an electric device using the card will be described bellow.

Figure 14:
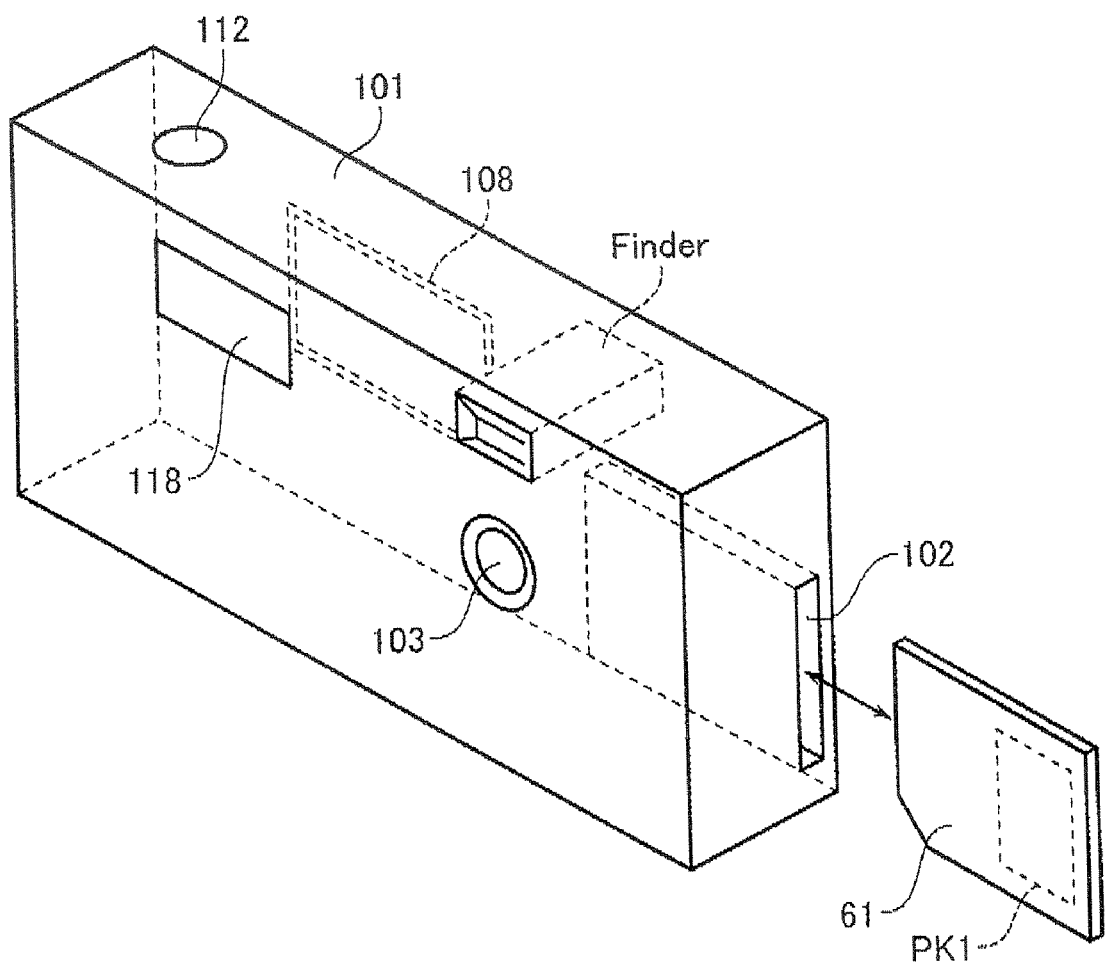
FIG. 14 shows another embodiment applied to a digital still camera.

FIG. 14 shows an electric card according to this embodiment and an arrangement of an electric device using this card. This electric device is a digital still camera 101 as an example of portable electric devices. The electric card is a memory card 61 used as a recording medium of the digital still camera 101. The memory card 61 incorporates an IC package PKR in which the non-volatile semiconductor memory device or the memory system according to the above-described embodiments is integrated or encapsulated.

The case of the digital still camera 101 accommodates a card slot 102 and a circuit board (not shown) connected to this card slot 102. The memory card 61 is detachably inserted in the card slot 102 of the digital still camera 101. When inserted in the slot 102, the memory card 61 is electrically connected to electric circuits of the circuit board.

If this electric card is a non-contact type IC card, it is electrically connected to the electric circuits on the circuit board by radio signals when inserted in or approached to the card slot 102.

Figure 15:
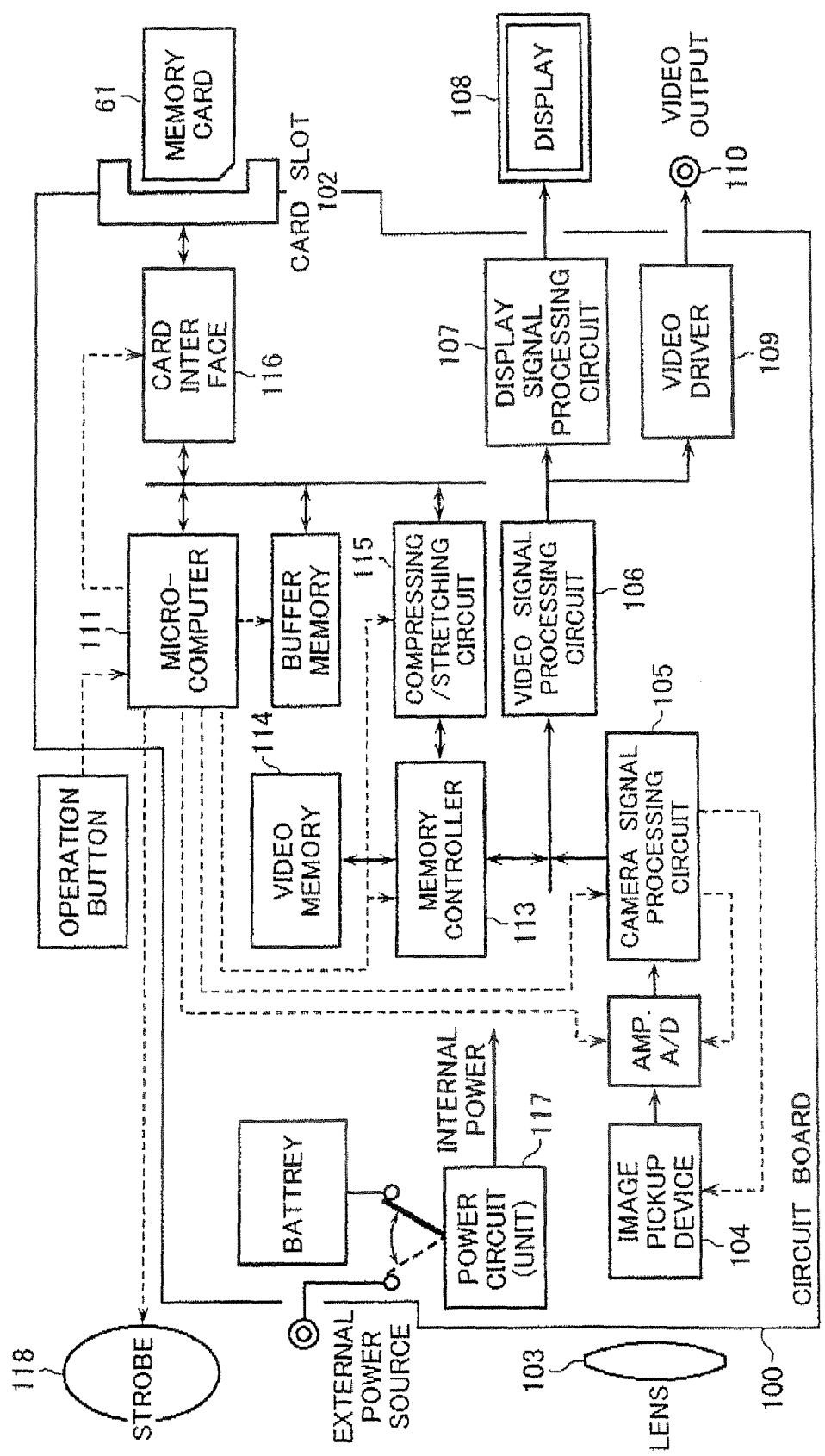
FIG. 15 shows the internal configuration of the digital still camera.
Figure 16A:
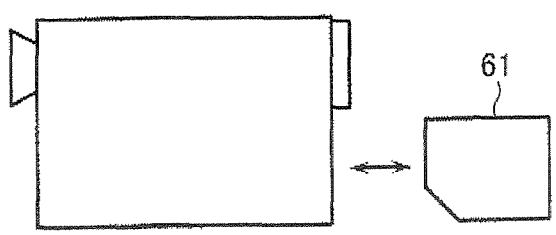
FIGS. 16A to 16J show other electric devices to which the embodiment is applied.
Figure 16F:
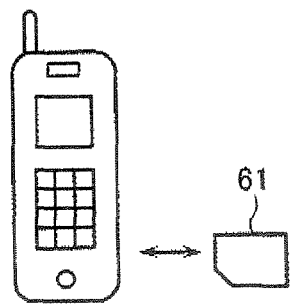
Figure 16B:
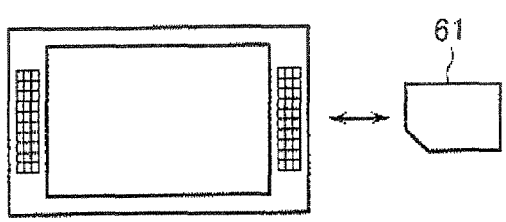
Figure 16G:
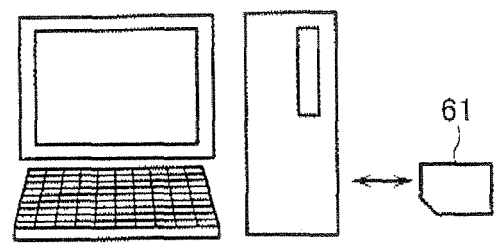
Figure 16C:
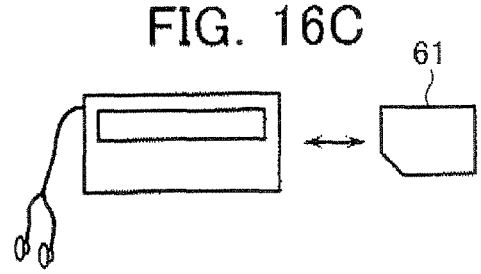
Figure 16H:
Figure 16D:
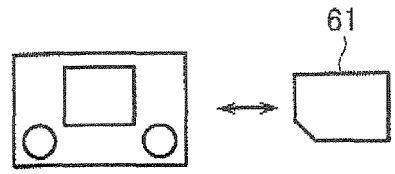
Figure 16I:
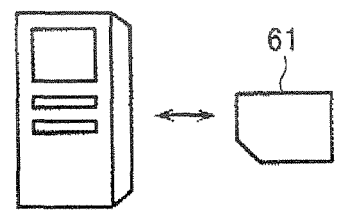
Figure 16E:
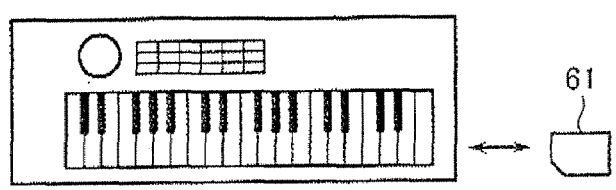
Figure 16J:
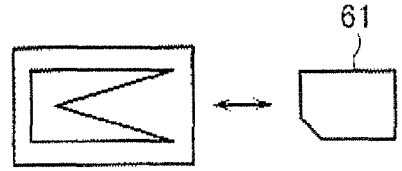

FIG. 15 shows a basic arrangement of the digital still camera. Light from an object is converged by a lens 103 and input to an image pickup device 104. The image pickup device 104 is, for example, a CMOS sensor and photoelectrically converts the input light to output, for example, an analog signal. This analog signal is amplified by an analog amplifier (AMP), and converted into a digital signal by an A/D converter (A/D). The converted signal is input to a camera signal processing circuit 105 where the signal is subjected to automatic exposure control (AE), automatic white balance control (AWB), color separation, and the like, and converted into a luminance signal and color difference signals.

To monitor the image, the output signal from the camera processing circuit 105 is input to a video signal processing circuit 106 and converted into a video signal. The system of the video signal is, e.g., NTSC (National Television System Committee) The video signal is input to a display 108 attached to the digital still camera 101 via a display signal processing circuit 107. The display 108 is, e.g., a liquid crystal monitor.

The video signal is supplied to a video output terminal 110 via a video driver 109. An image picked up by the digital still camera 101 can be output to an image apparatus such as a television set via the video output terminal 110. This allows the pickup image to be displayed on an image apparatus other than the display 108. A microcomputer 111 controls the image pickup device 104, analog amplifier (AMP), A/D converter (A/D), and camera signal processing circuit 105.

To capture an image, an operator presses an operation button such as a shutter button 112. In response to this, the microcomputer 111 controls a memory controller 113 to write the output signal from the camera signal processing circuit 105 into a video memory 114 as a flame image. The flame image written in the video memory 114 is compressed on the basis of a predetermined compression format by a compressing/stretching circuit 115. The compressed image is recorded, via a card interface 116, on the memory card 61 inserted in the card slot.

To reproduce a recorded image, an image recorded on the memory card 61 is read out via the card interface 116, stretched by the compressing/stretching circuit 115, and written into the video memory 114. The written image is input to the video signal processing circuit 106 and displayed on the display 108 or another image apparatus in the same manner as when image is monitored.

In this arrangement, mounted on the circuit board 100 are the card slot 102, image pickup device 104, analog amplifier (AMP), A/D converter (A/D), camera signal processing circuit 105, video signal processing circuit 106, display signal processing circuit 107, video driver 109, microcomputer 111, memory controller 113, video memory 114, compressing/stretching circuit 115, and card interface 116.

The card slot 102 need not be mounted on the circuit board 100, and can also be connected to the circuit board 100 by a connector cable or the like.

A power circuit 117 is also mounted on the circuit board 100. The power circuit 117 receives power from an external power source or battery and generates an internal power source voltage used inside the digital still camera 101. For example, a DC-DC converter can be used as the power circuit 117. The internal power source voltage is supplied to the respective circuits described above, and to a strobe 118 and the display 108.

As described above, the electric card according to this embodiment can be used in portable electric devices such as the digital still camera explained above. However, the electric card can also be used in various apparatus such as shown in FIGS. 16A to 16J, as well as in portable electric devices. That is, the electric card can also be used in a video camera shown in FIG. 16A, a television set shown in FIG. 16B, an audio apparatus shown in FIG. 16C, a game apparatus shown in FIG. 16D, an electric musical instrument shown in FIG. 16E, a cell phone shown in FIG. 16F, a personal computer shown in FIG. 16G, a personal digital assistant (PDA) shown in FIG. 16H, a voice recorder shown in FIG. 161, and a PC card shown in FIG. 16J, This invention is not limited to the above-described embodiment. It will be understood by those skilled in the art that various changes in form and detail may be made without departing from the spirit, scope, and teaching of the invention.

What is claimed is:

1. A semiconductor memory device comprising:
    a cell array with electrically rewritable and non-volatile memory cells disposed at crossings between bit lines and word lines, which intersect with each other;
    a row decoder configured to drive the word lines; and
    a sense amplifier so coupled to a selected bit line as to compare a cell current with a reference current and sense data of a selected memory cell in the cell array, wherein
    bit line precharge is performed for a certain time prior to the sense amplifier activation in a data read mode while word line boost is performed in advance of the bit line precharge.

2. The semiconductor memory device according to claim 1, further comprising:
    a first bit line precharge circuit disposed at a bit line end near the sense amplifier for precharging a bit line for a certain time in advance of the sense amplifier activation; and
    a second bit line precharge circuit disposed at another bit line end far from the sense amplifier for precharging a bit line simultaneously with the first bit line precharge circuit.

3. The semiconductor memory device according to claim 1, further comprising a bit line precharge circuit attached to the sense amplifier for precharging a bit line for a certain time in advance of the sense amplifier activation, wherein
    the bit line precharge current is supplied in such a manner that it is changed in correspondence with a selected area in the bit line direction in the call array.

4. The semiconductor memory device according to claim 3, wherein
    the bit line precharge current is selected under the control of the gate voltage of a transistor disposed between the sense amplifier and the bit line.

5. The semiconductor memory device according to claim 1, wherein
    the cell array includes first and second arrays disposed to sandwich the sense amplifier, the first and second arrays each having a plurality of information cells, in which a certain data level is written to generate the cell current at a data read time, and at least one reference cell for generating the reference current, and wherein
    the sense amplifier detects cell current difference between an information cell selected from one of the first and second arrays and a reference cell selected from the other array to sense data of the information cell at a data read time.

6. The semiconductor memory device according to claim 5, wherein
    one of multi-level data expressed by two bits or more is written into the information cell while a reference level is written into the reference cell.

7. The semiconductor memory device according to claim 5, wherein
    the first and second arrays each includes a plurality of information cell blocks in which information cell NAND strings are arranged and at least one reference cell block in which reference cell NAND strings are arranged.

8. A semiconductor memory device comprising:
    a cell array with electrically rewritable and non-volatile memory cells disposed at crossings between bit lines and word lines, which intersect with each other;
    a sense amplifier so coupled to a selected bit line as to sense data of a selected memory cell in the cell array;
    a first bit line precharge circuit so disposed at one end of a bit line near the sense amplifier as to precharge the bit line for a certain time prior to the sense amplifier activation; and
    a second bit line precharge circuit so disposed at the other end of the bit line far from the sense amplifier as to precharge the bit line simultaneously with the first bit line precharge circuit.

9. The semiconductor memory device according to claim 8, wherein
    the cell array includes first and second arrays disposed to sandwich the sense amplifier, the first and second arrays each having a plurality of information cells, in which a certain data level is written to generate the cell current at a data read time, and at least one reference cell for generating the reference current, and wherein
    the sense amplifier detects cell current difference between an information cell selected from one of the first and second arrays and a reference cell selected from the other array to sense data of the information cell at a data read time.

10. The semiconductor memory device according to claim 9, wherein
    one of multi-level data expressed by two bits or more is written into the information cell while a reference level is written into the reference cell.

11. The semiconductor memory device according to claim 9, wherein
    the first and second arrays each includes a plurality of information cell blocks in which information cell NAND strings are arranged and at least one reference cell block in which reference cell NAND strings are arranged.

12. A semiconductor memory device comprising:
a cell array with electrically rewritable and non-volatile memory cells disposed at crossings between bit lines and word lines, which intersect with each other;
a sense amplifier so coupled to a selected bit line as to sense data of a selected memory cell in the cell array; and
a bit line precharge circuit attached to the sense amplifier for precharging a bit line for a certain time in advance of the sense amplifier activation, wherein
the bit line precharge current is supplied in such a manner that it is changed in correspondence with a selected area in the bit line direction in the cell arrays.

13. The semiconductor memory device according to claim 12, wherein
the bit line precharge current is selected under the control of the gate voltage of a transistor disposed between the sense amplifier and the bit line.

14. The semiconductor memory device according to claim 12, wherein
the cell array includes first and second arrays disposed to sandwich the sense amplifier, the first and second arrays each having a plurality of information cells, in which a certain data level is written to generate the cell current at a data read time, and at least one reference cell for generating the reference current, and wherein
the sense amplifier detects cell current difference between an information cell selected from one of the first and second arrays and a reference cell selected from the other array to sense data of the information cell at a data read time.

15. The semiconductor memory device according to claim 14, wherein
one of multi-level data expressed by two bits or more is written into the information cell while a reference level is written into the reference cell.

16. The semiconductor memory device according to claim 14, wherein
the first and second arrays each includes a plurality of information cell blocks in which information cell NAND strings are arranged and at least one reference cell block in which reference cell NAND strings are arranged.

17. A semiconductor memory device comprising:
a cell array with electrically rewritable and non-volatile memory cells disposed at crossings between bit lines and word lines, which intersect with each other, a plurality of memory cells being connected in series to constitute a NAND string in the cell array; and
a sense amplifier so coupled to a selected bit line as to sense data of a selected memory cell in the cell array, wherein
data write of the cell array is performed in such a way that memory cells in the NAND string are sequentially selected from the bit line side, so that the word line coupling current input to the sense amplifier at a write-verify time is equalized to that at a normal read time.

* * * * *